US011258245B2

(12) United States Patent
Li et al.

(10) Patent No.: US 11,258,245 B2
(45) Date of Patent: Feb. 22, 2022

(54) INTELLIGENT LEAKAGE CURRENT DETECTION AND INTERRUPTION DEVICE FOR POWER CORD

(71) Applicant: Chengli Li, Suzhou (CN)

(72) Inventors: Chengli Li, Suzhou (CN); Long Chen, Suzhou (CN)

(73) Assignee: Chengli Li, Suzhou (CN)

( * ) Notice: Subject to any disclaimer, the term of this patent is extended or adjusted under 35 U.S.C. 154(b) by 0 days.

(21) Appl. No.: 17/013,610

(22) Filed: Sep. 6, 2020

(65) Prior Publication Data

US 2021/0006060 A1 Jan. 7, 2021

Related U.S. Application Data

(63) Continuation-in-part of application No. 16/212,505, filed on Dec. 6, 2018, now Pat. No. 10,840,698, which is a continuation-in-part of application No. 15/718,661, filed on Sep. 28, 2017, now Pat. No. 10,557,883.

(30) Foreign Application Priority Data

Aug. 28, 2020 (CN) ........................ 202021831914.X

(51) Int. Cl.

| | |
|---|---|
| ***H02H 3/16*** | (2006.01) |
| ***G01R 31/58*** | (2020.01) |
| ***G01R 31/52*** | (2020.01) |
| ***H02H 1/00*** | (2006.01) |
| *H02H 3/17* | (2006.01) |

(Continued)

(52) U.S. Cl.
CPC ............... *H02H 3/16* (2013.01); *G01R 31/52* (2020.01); *G01R 31/58* (2020.01); *H02H 1/0007* (2013.01); *G01R 31/008* (2013.01); *H02H 3/17* (2013.01); *H02H 9/08* (2013.01)

(58) Field of Classification Search
CPC .......... H02H 3/16; H02H 1/00; H02H 1/0007; H02H 3/00; H02H 9/08; H02H 3/17; H02H 3/08; H02H 3/02; G01R 31/52; G01R 31/58; G01R 31/008
USPC ..................................................... 361/42–50
See application file for complete search history.

(56) References Cited

U.S. PATENT DOCUMENTS 4,707,759 A 11/1987 Bodkin
5,708,364 A 1/1998 Vokey et al.
(Continued)

*Primary Examiner* — Danny Nguyen
(74) *Attorney, Agent, or Firm* — Chen Yoshimura LLP

(57) ABSTRACT

An intelligent leakage current detection and interruption device for a power cord, including a switch module for controlling electrical connection of two power lines between input and output ends; a leakage current detection module, including two leakage current detection lines and a signal feedback line, one end of the parallelly coupled two leakage current detection lines being coupled via the signal feedback line to a point between the two power lines, for respectively detecting a leakage current on the two power lines; a detection monitoring module, coupled to the leakage current detection module, for detecting open circuit conditions in the two leakage current detection lines; and a drive module, coupled to the switch module, the leakage current detection module and the detection monitoring module, for driving the switch module to disconnect power to the output end in response to any detected leakage current or open circuit condition.

10 Claims, 5 Drawing Sheets

(51) Int. Cl.
*H02H 9/08* (2006.01)
*G01R 31/00* (2006.01)

(56) References Cited

U.S. PATENT DOCUMENTS

| | | | | |
|---|---|---|---|---|
| 6,697,238 | B2 | 2/2004 | Bonilla et al. | |
| 8,605,402 | B2 | 12/2013 | Ward et al. | |
| 9,312,680 | B2 | 4/2016 | Li et al. | |
| 9,331,582 | B2 | 5/2016 | Goerke | |
| 9,356,402 | B2 | 5/2016 | Sung et al. | |
| 9,535,106 | B2 | 1/2017 | Li | |
| 9,547,047 | B2 | 1/2017 | Li et al. | |
| 9,564,119 | B2 | 2/2017 | Ryu et al. | |
| 9,697,926 | B2 | 7/2017 | Huang et al. | |
| 10,840,698 | B2 | 11/2020 | Li et al. | |
| 10,886,724 | B2 | 1/2021 | Li et al. | |
| 2006/0119997 | A1 | 6/2006 | Lee | |
| 2007/0159740 | A1 | 7/2007 | Williams et al. | |
| 2008/0007878 | A1* | 1/2008 | Gandolfi | H01B 9/028 361/42 |
| 2008/0062593 | A1* | 3/2008 | Li | H02H 3/14 361/46 |
| 2010/0020452 | A1 | 1/2010 | Gandolfi | |
| 2012/0119918 | A1 | 5/2012 | Williams | |
| 2014/0117995 | A1 | 5/2014 | Topucharla | |
| 2015/0349517 | A1 | 12/2015 | Li et al. | |
| 2016/0111869 | A1 | 4/2016 | Li et al. | |
| 2017/0222425 | A1 | 8/2017 | Li et al. | |
| 2021/0027915 | A1 | 1/2021 | Aromin et al. | |
| 2021/0125746 | A1 | 4/2021 | Aromin et al. | |
| 2021/0125753 | A1 | 4/2021 | Aromin et al. | |
| 2021/0125754 | A1 | 4/2021 | Aromin et al. | |

* cited by examiner

INTELLIGENT LEAKAGE CURRENT DETECTION AND INTERRUPTION DEVICE FOR POWER CORD

BACKGROUND OF THE INVENTION

Field of the Invention

This invention relates to electrical appliances, and in particular, it relates to an intelligent leakage current detection and interruption device for power cord.

Description of Related Art

Leakage current detection and interruption devices (LCDI) are a type of safety device to protect against electrical fire. Its main structure is a power cord with a power plug, and it functions to detect leakage current between the hot line or neutral line and the shield layer along the cord from the plug to the electrical load (e.g., air conditioner, dehumidifier, etc.). When a leakage current is detected, the device interrupts the electrical power to the load to prevent fire and ensure safety. Such devices can prevent arc fault fire due to damaged and improper insulation of the hot line, neutral line and ground line of the power cord, which may be caused by aging, wear and tear, pinching, animal chewing, etc.

Current LCDI devices (see FIG. 1) has the following problems: when the leakage current detection line (shield line) 24 for the hot line L 21 or neutral line N 22 of the power line 2 is an open circuit and has lost its protection function, the power cord can still function to conduct power to the load. This presents a hidden threat of fire or other safety issue.

Therefore, there is a need for a leakage current detection and interruption device that can effectively detect leakage current.

SUMMARY

Accordingly, the present invention is directed to an intelligent leakage current detection and interruption device for a power cord, which includes: a switch module, configured to control an electrical connection of a first and a second power line between a power input end and a power output end; a leakage current detection module, including a first leakage current detection line, a second leakage current detection line, and a signal feedback line, wherein the first and second leakage current detection lines are coupled in parallel, one end of the parallelly coupled first and second leakage current detection lines is coupled via the signal feedback line to a point between the first and second power lines, wherein the first and second leakage current detection lines are configured to detect whether a leakage current is present on the first power line and the second power line, respectively; a detection monitoring module, coupled to the leakage current detection module, and configured to detect whether an open circuit condition is present in the first or second leakage current detection line; and a drive module, coupled to the switch module, the leakage current detection module and the detection monitoring module, and configured to drive the switch module to cut off power to the power output end in response to any detected leakage current or open circuit condition.

In some embodiments, the detection monitoring module includes at least three resistors and at least one diode.

In some embodiments, the detection monitoring module includes a first resistor, a second resistor, a third resistor, and a first diode.

In some embodiments, the first resistor is coupled in series with the first leakage current detection line and coupled to a first common point, the second resistor is coupled in series with the second leakage current detection line and coupled to the first common point, the first diode is coupled between the first common point and one of the first and second power lines, a second common point of the first and second leakage current detection lines is coupled via the signal feedback line to a first end of the third resistor, and a second end of the third resistor is coupled via the drive module to another one of the first and second power lines.

In some embodiments, the first resistor is coupled in series with the first leakage current detection line and coupled to a first common point, the second resistor is coupled in series with the second leakage current detection line and coupled to the first common point, the first common point is coupled via the first diode to one of the first and second power lines, a second common point of the first and second leakage current detection lines is coupled via the signal feedback line to a first end of the third resistor, and a second end of the third resistor is coupled via the drive module to another one of the first and second power lines, and wherein the first diode is shared by the detection monitoring module and the drive module.

In some embodiments, the intelligent leakage current detection and interruption device further includes a test module which includes a test switch, wherein the test switch is coupled between the first leakage current detection line and one of the first and second power lines, and wherein when the test switch is closed and no open circuit condition is present on the first and second leakage current detection lines, the drive module drives the switch module to disconnect power to the output end.

The leakage current detection and interruption device can detect whether the first and second leakage current detection lines are intact with no open circuit conditions, thereby enhancing the reliability of the device.

BRIEF DESCRIPTION OF THE DRAWINGS

Preferred embodiments of the present invention are described with reference to the drawings. These drawings serve to explain the embodiments and their operating principle, and only illustrate structures that are necessary to the understanding of the principles of the invention. These drawings are not necessarily to scale. In the drawings, like features are designated by like reference symbols.

DETAILED DESCRIPTION OF PREFERRED EMBODIMENTS

Preferred embodiments of the present invention are described below with reference to the drawings. These drawings and descriptions explain embodiments of the invention but do not limit the invention. The described embodiments are not all possible embodiments of the present invention. Other embodiments are possible without departing from the spirit and scope of the invention, and the structure and/or logic of the illustrated embodiments may be modified. Thus, it is intended that the scope of the invention is defined by the appended claims. In the descriptions below, terms such as "including" are intended to be open-ended and mean "including without limitation", and can include other contents. "Based on" means "at least partly based on." "An embodiment" means "at least one embodiment." "Another embodiment" means "at least another embodiment," etc.

Embodiments of the present invention provide an intelligent leakage current detection and interruption device for a power cord, which includes: a switch module, configured to control an electrical connection between a power input end and a power output end of a first and a second power lines; leakage current detection module, including a first leakage current detection line and a second leakage current detection line, which are coupled in parallel and then to the first and second power lines, configured to detect whether a leakage current is present on the first power line and the second power line, respectively; a detection monitoring module, coupled to the switch module and the leakage current detection module, configured to detect whether an open circuit condition is present in the first or second leakage current detection line; and a drive module, coupled to the switch module, the leakage current detection module and the detection monitoring module, and configured to drive the switch module to cut off power to the power output end in response to the leakage current and the open circuit condition.

Figure 1:
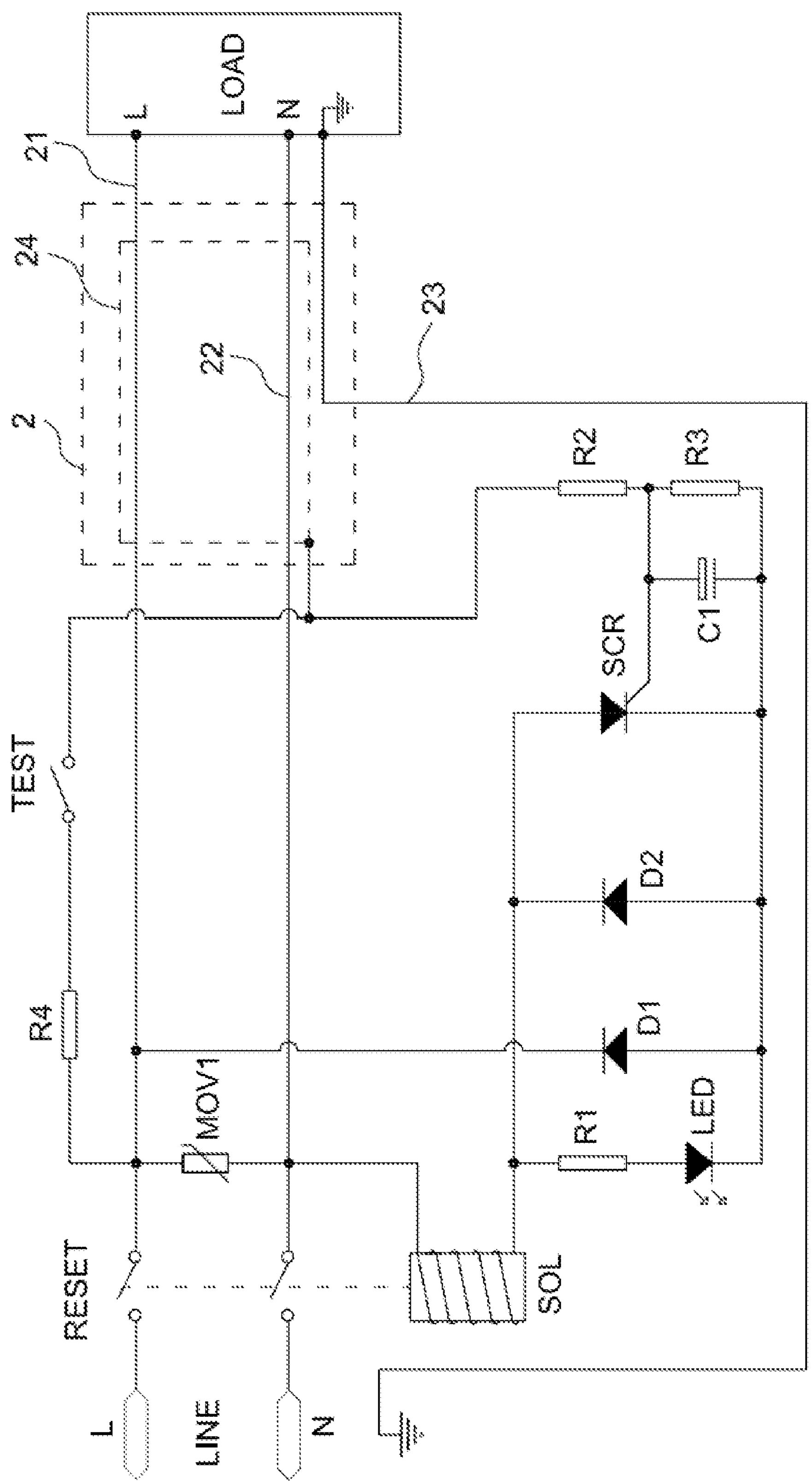
FIG. 1 is a circuit diagram of a conventional LCDI device.
Figure 2:
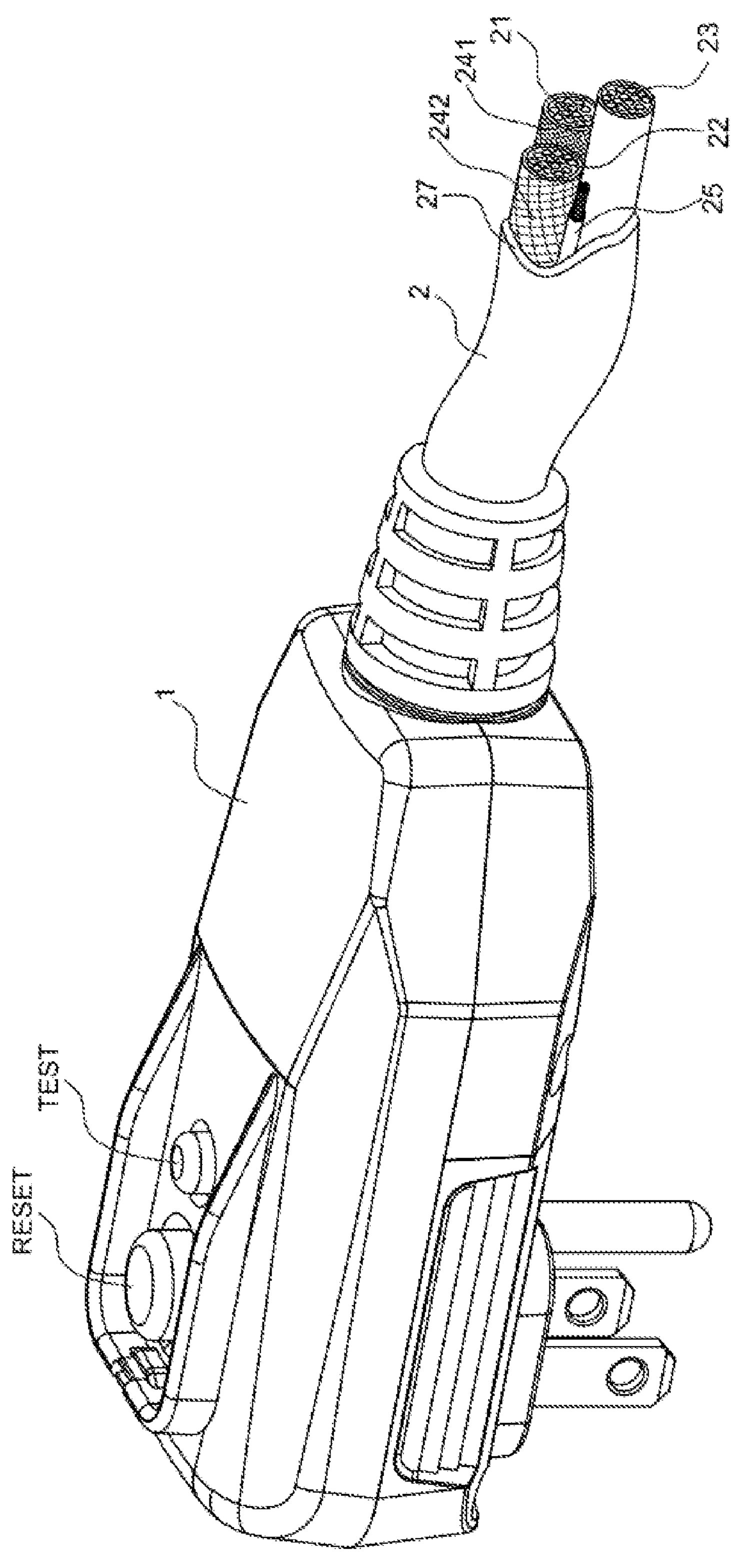
FIG. 2 is an exterior view of a power plug according to embodiments of the present invention.
Figure 3B:
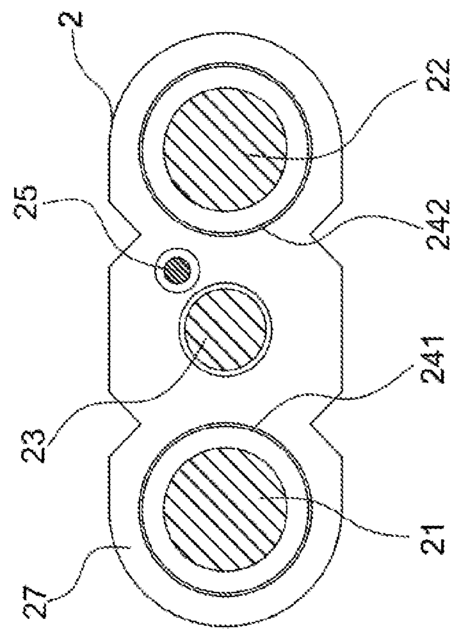
FIGS. 3A and 3B are cross-sectional views of the cord according to embodiments of the present invention.
Figure 3A:
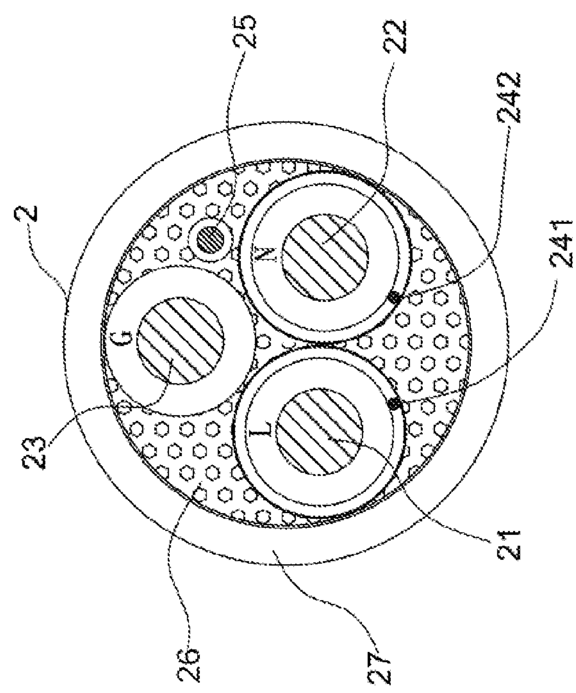

As shown in FIG. 2, the intelligent leakage current detection and protection device for a power cord has a plug 1 containing the switch module and an external power cord 2. The plug 1 includes a test switch TEST and a reset switch RESET. In the embodiment shown in FIG. 2, the power cord 2 includes a hot line (L) 21, a neutral line (N) 22, a ground line (G) 23, leakage current detection lines (shield lines) 241 and 242, a signal feedback line 25, an insulating cover 27, and filling materials 26. The signal feedback line 25 is a conductor having its own insulating layer, and can be disposed at any position of the power cord 2. The exterior cross-section of the power cord 2 may be round as shown in FIG. 3A, or may be a linear array of parallel wires as shown in FIG. 3B, or other shapes. It should be understood that in other embodiment, the power cord 2 may include other signal lines.

Figure 4:
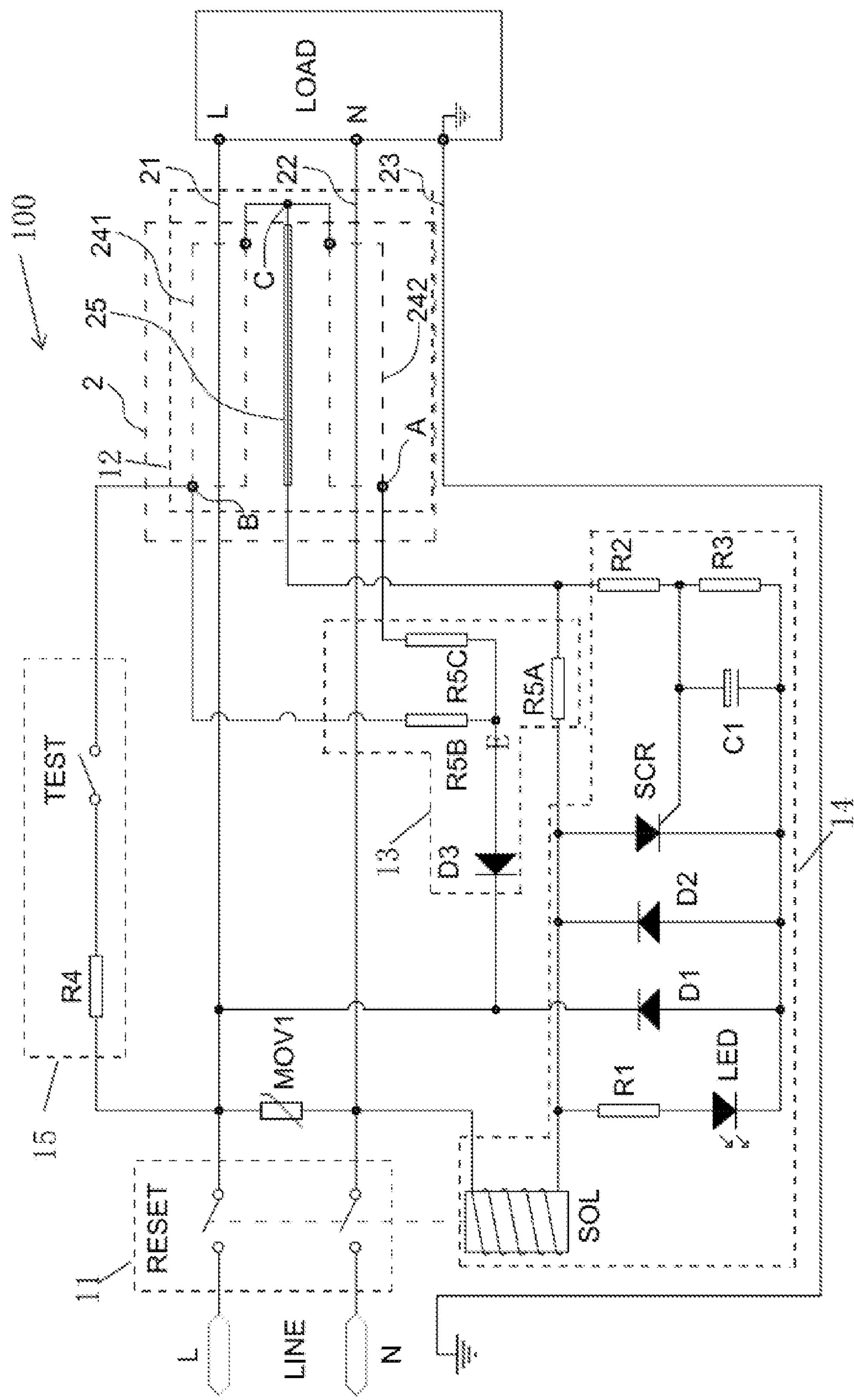
FIG. 4 is a circuit diagram showing an LCDI device according to a first embodiment of the present invention.

FIG. 4 is a circuit diagram showing an LCDI device according to a first embodiment of the present invention. As shown in FIG. 4, the intelligent leakage current detection and interruption device 100 for a power cord includes a switch module 11, a leakage current detection module 12, a detection monitoring module 13, and a drive module 14. The switch module 11 includes a reset switch RESET. The switch module 11 is configured to control the electrical connection between a power input end LINE and a power output end LOAD of the device. The leakage current detection module 12 includes at least leakage current detection lines 241 and 242. The leakage current detection lines 241 and 242 are coupled in parallel, and have a common point C (at the LOAD side of the leakage current detection lines) and a common point E (at the LINE side). The leakage current detection lines 241 and 242 respectively function to detect whether a leakage current is present on the hot line L and neutral line N. The detection monitoring module 13 is configured to detect whether the leakage current detection lines 241 and 242 have any open circuit fault condition. The detection monitoring module 13 includes resistors R5A, R5B and R5C, and diode D3. Resistor R5B (first detection resistor) is coupled in series with the leakage current detection line 241 and is coupled to the common point E; resistor R5C (second detection resistor) is coupled in series with the leakage current detection line 242 and is coupled to the common point E. One end of diode D3 is coupled to the common point E; the other end of diode D3 is coupled to the hot line L. The common point C is coupled to one end of resistor R5A (third detection resistor) via the signal feedback line 25, and further coupled to the neutral line N via resistor R5A. A voltage dividing resistor R2 of the drive module 14 is coupled at one end to the signal feedback line 25. The other end of resistor R5A is coupled to the anode of a silicon controlled rectifier SCR of the drive module 14 and to one end of a solenoid SOL of the drive module 14. The solenoid SOL is mechanically coupled to the reset switch RESET of the switch module 11. The drive module 14 further includes diodes D1 and D2, capacitor C1, resistors R2 and R3. The cathode and the control gate of the silicon controlled rectifier SCR are respectively coupled to the two ends of capacitor C1. Capacitor C1 is coupled in parallel with resistor R3. The other end of resistor R2 is coupled to one end of the parallelly coupled capacitor C1 and resistor R3 and also to the control gate of the silicon controlled rectifier SCR. The anode of diode D1 is coupled to the cathode of the silicon controlled rectifier SCR. The cathode of diode D1 is coupled to the hot line L and further to the switch module 11 via the hot line L.

The working principle of the circuit of FIG. 4 is as follows.

When a leakage current is present on the hot line L or neutral line N, the leakage current flows through the signal feedback line 25. Thus, the voltage across resistor R3 increases to a sufficient level to trigger the silicon controlled rectifier SCR to be conductive. This forms a current loop from the neutral line N via SOL-SCR-D1 to the hot line L. As a result, the solenoid SOL generates a magnetic field to actuate the reset switch RESET, causing the device to trip and cut off power to the load.

When the leakage current detection lines 241 and 242 are functioning normally (i.e., they do not have any open circuit condition), by the setting of the first detection resistor R5B, the second detection resistor R5C and the third detection resistor R5A, the common point C is limited to a relatively low voltage level, so the silicon controlled rectifier SCR is not triggered to conduct. In this condition, when the LCDI device is connected to the power source, it will function normally to conduct power to the load.

When an open circuit condition exists at any point on the leakage current detection line 241, a current loop is formed from the neutral line N via SOL-R5A-C-242-R5C-D3 to the hot line L, so that the voltage across resistor R3 increases to a sufficient level to trigger the silicon controlled rectifier SCR to be conductive. This forms a current loop from the neutral line N via SOL-SCR-D1 to the hot line L. As a result, the solenoid SOL generates a magnetic field to actuate the reset switch RESET, causing the device to trip and cut off power to the load.

When an open circuit condition exists at any point on the leakage current detection line 242, a current loop is formed from the neutral line N via SOL-R5A-C-241-R5B-D3 to the hot line L, so that the voltage across resistor R3 increases to a sufficient level to trigger the silicon controlled rectifier SCR to be conductive. This forms a current loop from the neutral line N via SOL-SCR-D1 to the hot line L. As a result, the solenoid SOL generates a magnetic field to actuate the reset switch RESET, causing the device to trip and cut off power to the load.

As shown in FIG. 4, the leakage current detection and interruption device 100 further includes a test module 15, which includes resistor R4 and test switch TEST. One end of resistor R4 is coupled in series to one end of the test switch TEST; the other end of resistor R4 is coupled to the hot line L and further to the switch module 11 via the hot line L. The other end of the test switch TEST is coupled to the leakage current detection line 241. Normally, the test switch TEST is open; so when the leakage current detection lines 241 and 242 are functioning normally (no open circuit condition) and there is no leakage current between the power lines 21, 22, 23 and the leakage current detection lines 241, 242, the silicon controlled rectifier SCR is not triggered and the LCDI device functions normally to conduct power to the load. When the test switch TEST is closed (e.g., when manually depressed by a user), a simulated leakage current flows in a test current loop from the hot line L via resistor R4, test switch TEST, leakage current detection lines 241, signal feedback line 25, resistors R2 and R3, diode D2, solenoid SOL to the neutral line N. This simulated current causes the voltage across resistor R3 to increase to a sufficient level, which triggers the silicon controlled rectifier SCR to be conductive. As seen from FIG. 4, when the silicon controlled rectifier SCR is conductive, a trip current loop is formed from the neutral line N via solenoid SOL, silicon controlled rectifier SCR, and diode D1 to the hot line L. As a result, the current in the solenoid SOL generates a magnetic field to actuate the reset switch RESET, causing the device to trip and cut off the power to the load. When any circuit or components on the test current loop has an open circuit condition, the device will not trip when the test switch TEST is closed. Therefore, the user can manually operate the test switch TEST to test whether the leakage current detection lines 241 and 242 are intact and functioning normally. It should be understood that the test switch TEST can test whether any component on the test current loop has an open circuit condition.

It should be understood that although in FIG. 4, the cathodes of diodes D1 and D3 are coupled to the hot line L and the upper end of solenoid SOL is coupled to the neutral line N, in alternative embodiments, the cathodes of diodes D1 and D3 may be coupled to the neutral line N and the upper end of solenoid SOL is coupled to the hot line L. It should also be understood that although in FIG. 4, the detection monitoring module 13 includes only one diode D3, in alternative embodiments, the detection monitoring module 13 may include multiple capacitors coupled in parallel and then to the common point E. In other alternative embodiments, each of leakage current detection lines 241 and 242 may be coupled in series with multiple resistors. In other alternative embodiments, multiple resistors may be coupled in series between the signal feedback line 25 and the anode of the silicon controlled rectifier SCR. In other embodiments, the leakage current detection module does not include any signal feedback lines, but rather, the common point C is coupled directly to resistor R5A.

Figure 5:
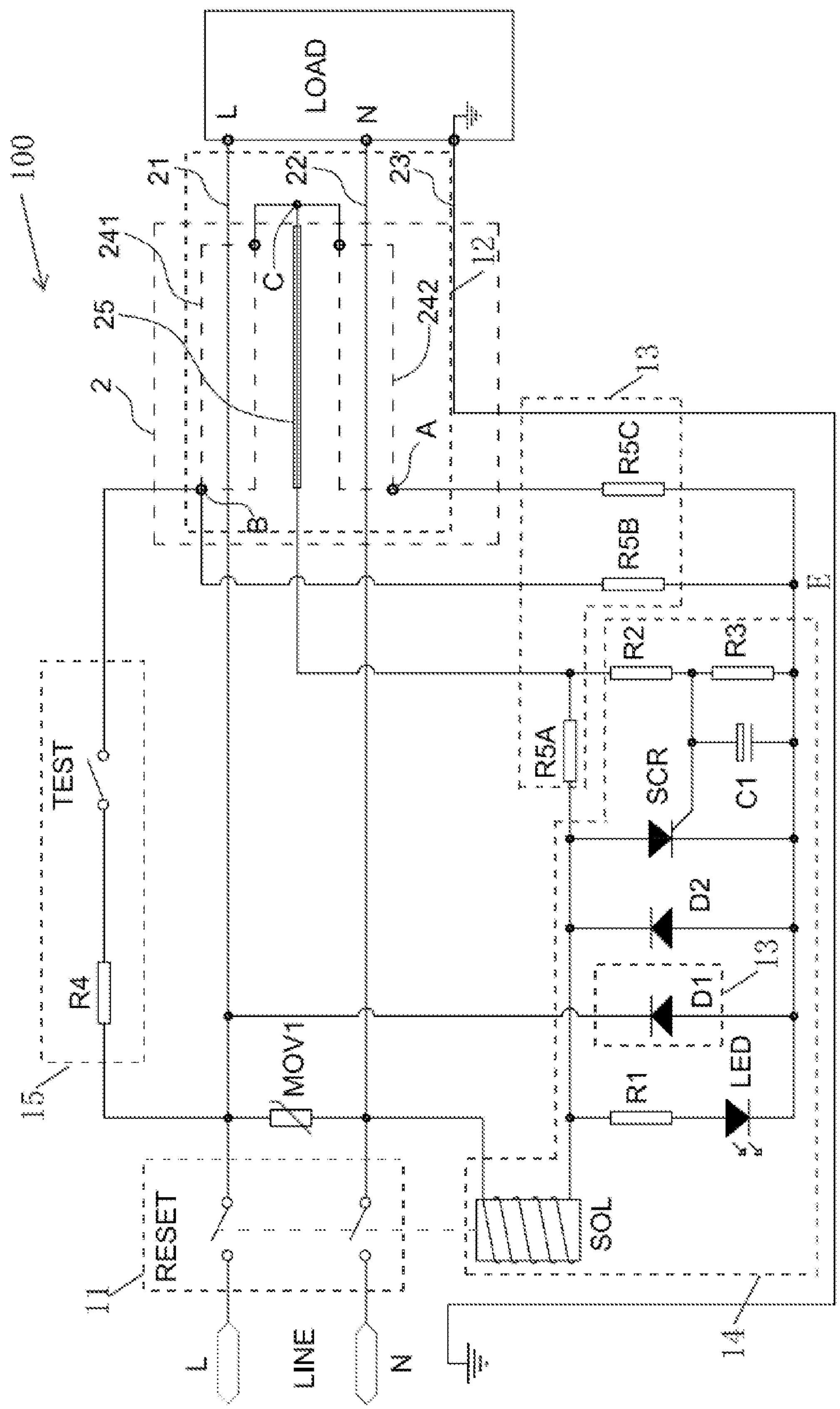
FIG. 5 is a circuit diagram showing an LCDI device according to a second embodiment of the present invention.

FIG. 5 is a circuit diagram schematically illustrating an LCDI device according to a second embodiment of the present invention.

This embodiment is similar to the first embodiment in FIG. A, but here, the detection monitoring module 13 does not include diode D3. Rather, the detection monitoring module 13 includes resistors R5A, R5B, R5C and diode D1, where diode D1 is shared by the drive module 14 and the detection monitoring module 13. The common end of resistors R5B and R5C (common point E) is coupled to the cathode of the silicon controlled rectifier SCR, and further coupled to the hot line L via diode D1.

The working principle of the circuit of FIG. 5 is as follows.

When the leakage current detection lines 241 and 242 are functioning normally (no open circuit), by the setting of the first detection resistor R5B, the second detection resistor R5C and the third detection resistor R5A, the point C is limited to a relatively low voltage level, so the silicon controlled rectifier SCR is not triggered to conduct. In this condition, when the LCDI device is connected to the power source, it will function normally to conduct power to the load.

When an open circuit condition exists at any point on the leakage current detection line 241, a current loop is formed from the neutral line N via SOL-R5A-C-242-R5C-D1 to the hot line L, so that the voltage across resistor R3 increases to a sufficient level to trigger the silicon controlled rectifier SCR to be conductive. This forms a current loop from the neutral line N via SOL-SCR-D1 to the hot line L. As a result, the solenoid SOL generates a magnetic field to actuate the reset switch RESET, causing the device to trip and cut off power to the load.

When an open circuit condition exists at any point on the leakage current detection line 242, a current loop is formed from the neutral line N via SOL-R5A-C-241-R5B-D1 to the hot line L, so that the voltage across resistor R3 increases to a sufficient level to trigger the silicon controlled rectifier SCR to be conductive. This forms a current loop from the neutral line N via SOL-SCR-D1 to the hot line L. As a result, the solenoid SOL generates a magnetic field to actuate the reset switch RESET, causing the device to trip and cut off power to the load.

In the embodiment of FIG. 5, the working principle of the test module is the same as in the first embodiment in FIG. 4 and will not be further described.

The LCDI devices according to embodiments of the present invention can monitor the leakage current detection circuit, thereby improving the safety of the device. Moreover, the device has a simple structure and is inexpensive to manufacture.

While the present invention is described above using specific examples, these examples are only illustrative and do not limit the scope of the invention. It will be apparent to those skilled in the art that various modifications, additions and deletions can be made to the LCDI device of the present invention without departing from the spirit or scope of the invention.

What is claimed is:

1. An intelligent leakage current detection and interruption device for a power cord, comprising:

a first power line and a second power line, each having a power input end and a power output end;

a switch module, configured to control an electrical connection of the first and second power lines between the power input end and the power output end;

a leakage current detection module, including a first leakage current detection line, a second leakage current detection line, and a signal feedback line, wherein the first and second leakage current detection lines are coupled in parallel, one end of the parallelly coupled first and second leakage current detection lines is coupled via the signal feedback line to a point between the first and second power lines, wherein the first and second leakage current detection lines are configured to detect whether a leakage current is present on the first power line and the second power line, respectively;

a detection monitoring module, coupled to the leakage current detection module, and configured to detect whether an open circuit condition is present in the first or second leakage current detection line; and a drive module, coupled to the switch module, the leakage current detection module and the detection monitoring module, and configured to drive the switch module to cut off power to the power output end in response to any detected leakage current or open circuit condition.

2. The intelligent leakage current detection and interruption device of claim 1, wherein the detection monitoring module includes at least three resistors and at least one diode.

3. The intelligent leakage current detection and interruption device of claim 1, wherein the detection monitoring module includes a first resistor, a second resistor, a third resistor, and a first diode.

4. The intelligent leakage current detection and interruption device of claim 3, wherein the first resistor is coupled in series with the first leakage current detection line and coupled to a first common point, the second resistor is coupled in series with the second leakage current detection line and coupled to the first common point, the first diode is coupled between the first common point and one of the first and second power lines, a second common point of the first and second leakage current detection lines is coupled via the signal feedback line to a first end of the third resistor, and a second end of the third resistor is coupled via the drive module to another one of the first and second power lines.

5. The intelligent leakage current detection and interruption device of claim 3, wherein the first resistor is coupled in series with the first leakage current detection line and coupled to a first common point, the second resistor is coupled in series with the second leakage current detection line and coupled to the first common point, the first common point is coupled via the first diode to one of the first and second power lines, a second common point of the first and second leakage current detection lines is coupled via the signal feedback line to a first end of the third resistor, and a second end of the third resistor is coupled via the drive module to another one of the first and second power lines, and wherein the first diode is shared by the detection monitoring module and the drive module.

6. The intelligent leakage current detection and interruption device of claim 1, further comprising a test module which includes a test switch, wherein the test switch is coupled between the first leakage current detection line and one of the first and second power lines, and wherein when the test switch is closed and no open circuit condition is present on the first and second leakage current detection lines, the drive module drives the switch module to disconnect power to the output end.

7. The intelligent leakage current detection and interruption device of claim 1, wherein the drive module includes a semiconductor switch having a current path and a control gate, a resistor coupled to the control gate of the semiconductor switch, and an actuator coupled to the current path of the semiconductor switch, the actuator being mechanically coupled to the switch module.

8. The intelligent leakage current detection and interruption device of claim 1, wherein the first and second leakage current detection lines are first and second shield lines respectively covering the first and second power lines.

9. The intelligent leakage current detection and interruption device of claim 1, wherein the signal feedback line is a conductor individually covered by an insulating layer.

10. The intelligent leakage current detection and interruption device of claim 1, wherein the signal feedback line is insulated from the first and second leakage current detection lines except for the coupling at the one end of the first and second leakage current detection lines.

* * * * *

UNITED STATES PATENT AND TRADEMARK OFFICE

CERTIFICATE OF CORRECTION

PATENT NO. : 11,258,245 B2
APPLICATION NO. : 17/013610
DATED : February 22, 2022
INVENTOR(S) : Chengli Li and Long Chen It is certified that error appears in the above-identified patent and that said Letters Patent is hereby corrected as shown below:

On the Title Page

At (30) Foreign Application Priority Data, left column, insert the following:
--Sept. 22, 2017 (CN) ............................. 201710864829.X
Sept. 22, 2017 (CN) ............................. 201721222432.2
Nov. 22, 2018 (CN) ............................. 201821930686.4--

Signed and Sealed this
Seventeenth Day of May, 2022

Katherine Kelly Vidal

Katherine Kelly Vidal
*Director of the United States Patent and Trademark Office*